United States Patent [19]

Norden

[11] Patent Number: 4,500,579
[45] Date of Patent: Feb. 19, 1985

[54] STICKS OF PARTS AND THEIR USE

[76] Inventor: Alexander R. Norden, 350 Central Park West, New York, N.Y. 10025

[21] Appl. No.: 428,382

[22] Filed: Sep. 29, 1982

[51] Int. Cl.³ .......................... B32B 1/04; B32B 15/00
[52] U.S. Cl. ...................................... 428/43; 206/328; 428/174; 428/543
[58] Field of Search ................ 428/43, 174, 12, 542.8, 428/543; 206/328, 330; 29/163.5, DIG. 37

[56] References Cited

U.S. PATENT DOCUMENTS 3,731,254  5/1973  Hey ...................................... 206/328
4,021,095  5/1977  Kincaid et al. ....................... 206/330

Primary Examiner—Paul J. Thibodeau

[57] ABSTRACT

The preferred sheet-metal strips of parts as disclosed have rows of connections to break-away strips each of which is removable by rocking it about an axis along the row of connections, tearing connection-weakening incisions that extend across said axis. Each connection can be weak and easily broken and yet each part is safely held by distributed connections against being knocked free or distorted in handling. The parts have projections that form a pattern for gang-assembly to a like pattern of receptor elements. The strip of parts is stiffened, becoming a stick of parts, by disposing one or both break-away strips at an angle to a common plane of portions of the parts that are unified by break-away connections.

18 Claims, 14 Drawing Figures

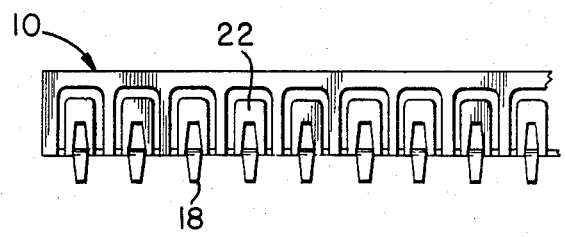
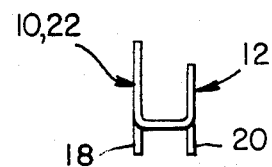
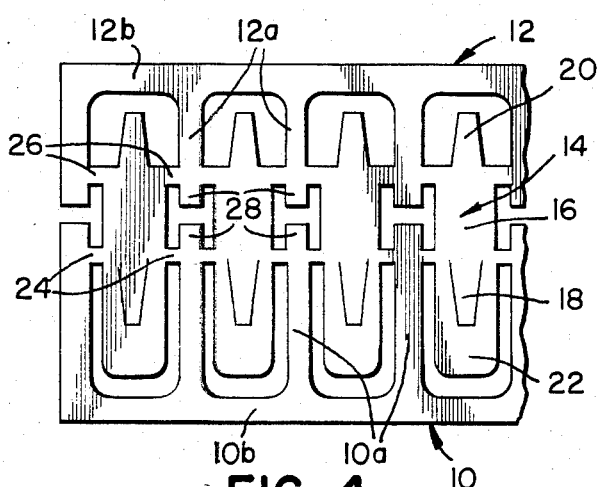
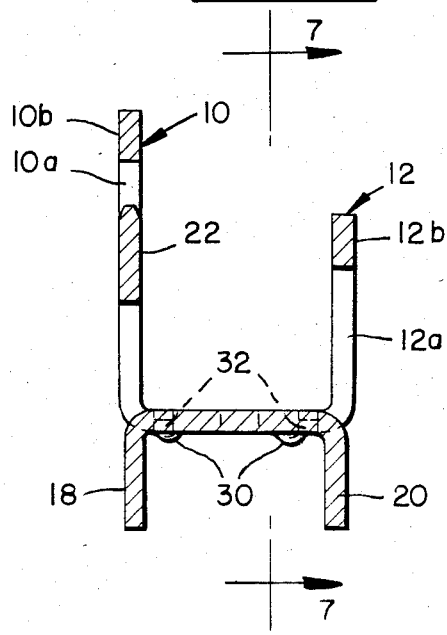
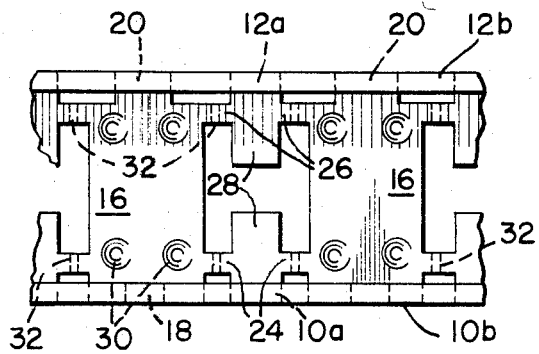
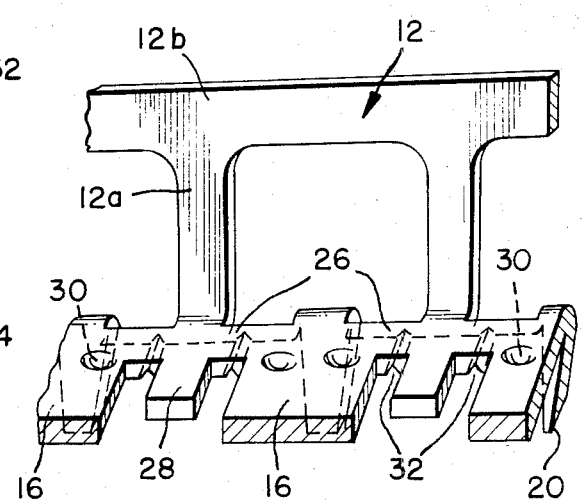
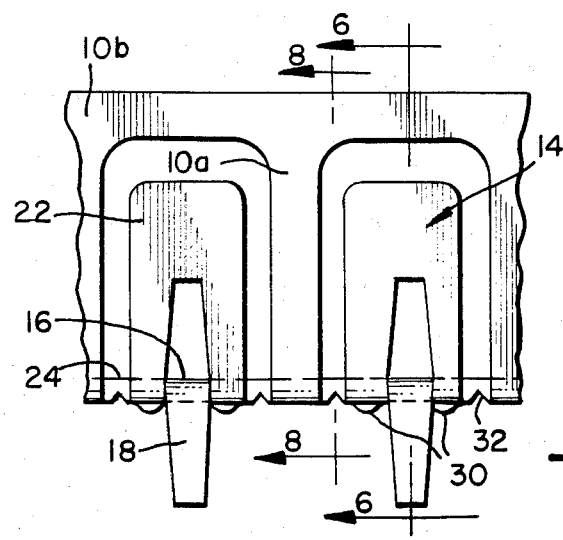

U.S. Patent Feb. 19, 1985 Sheet 2 of 2 4,500,579
FIG. 8.
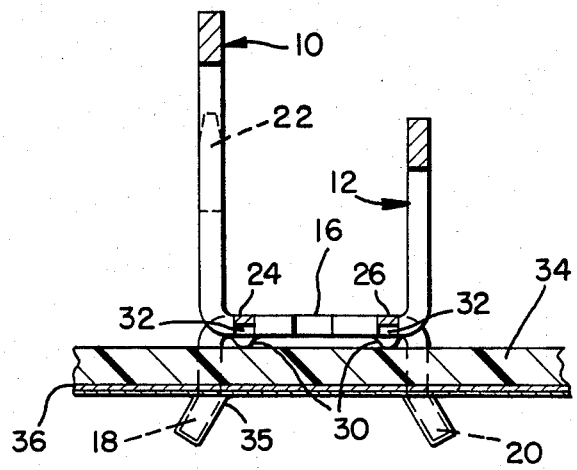
FIG. 12.
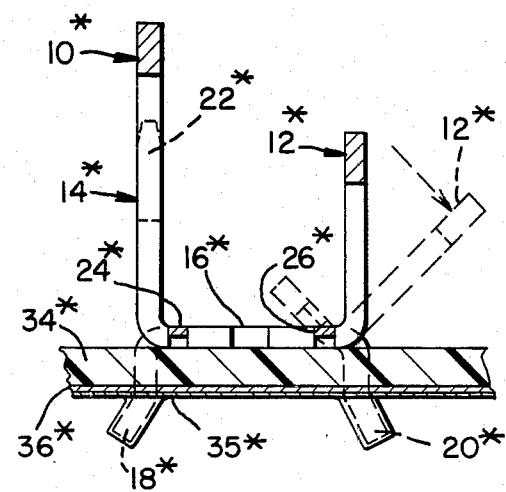
FIG. 9.
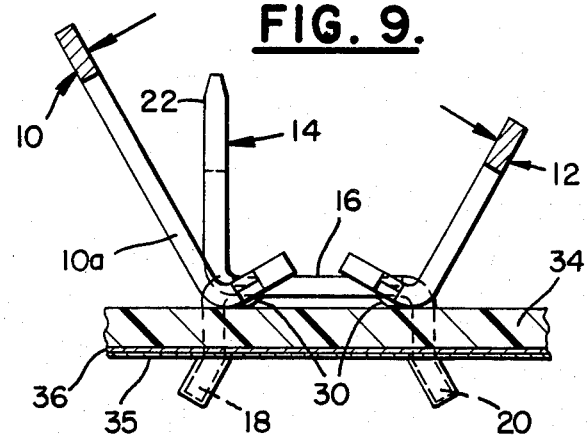
FIG. 13.
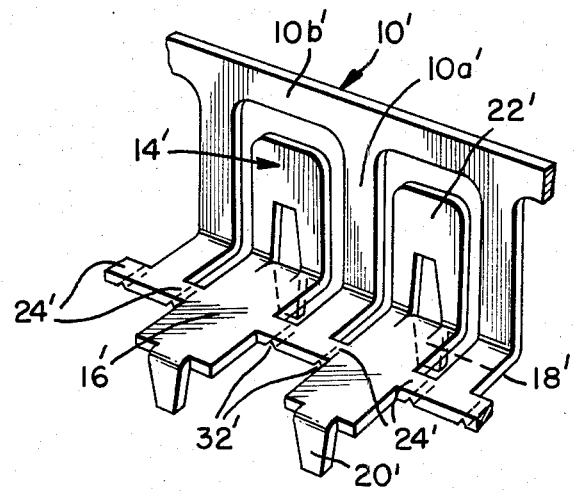
FIG. 10.
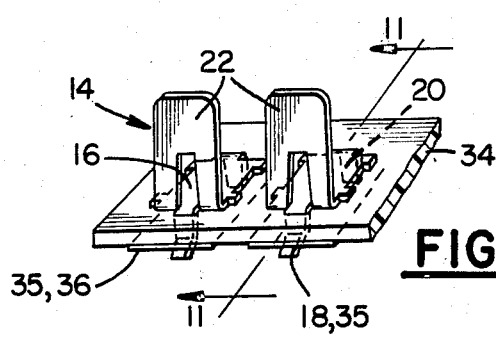
FIG. 14.
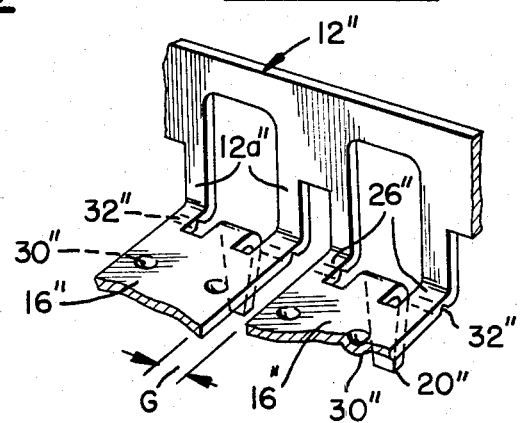
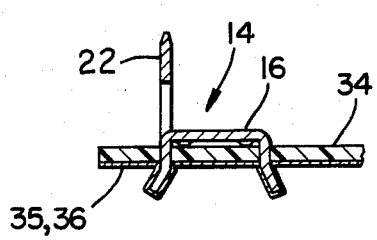
FIG. 11.

STICKS OF PARTS AND THEIR USE

The present invention relates to strips of metal parts that are intended to be asembled to a pattern of receptor elements, especially holes in a printed circuit board, and to methods of assembling a series of parts to receptor elements.

A long-established method of assembling metal parts to receptors such as holes in printed circuit boards is to form the metal parts as interconnected parts of a strip. In one mode of use, the strip is fed into a machine that cuts one part after another from a continuous strip bearing the parts, and the machine applies or inserts the parts successively at the required positions, one after another.

In another mode of use, the metal parts are united by a break-away metal strip. The parts are assembled as a group to a series of companion metal parts or they are gang-inserted into a row of holes in a printed-circuit board or other receptor. The strip of parts is not normally continuous, unlike strips used in the one-by-one assembly of the parts. Instead, the length of the strip is tailored to provide a number of metal parts that are to be mounted as a group or gang-assembled in any one operation.

The strip of parts is held together in properly spaced distribution by a break-away connecting strip. After the parts are assembled and fixed in place, the break-away interconnecting strip is removed so as to leave the metal parts secured to the receptor and disconnected from each other. A row of weakening incisions is formed in the necks connecting the parts to the interconnecting break-away strip. The incisions are arranged along a straight line and each incision extends along that line. After the parts of a strip have been mounted and secured in place, the break-away strip is removed. This is done by treating the aligned incisions as a hinge, rocking the connecting strip about that hinge back and forth as may be necessary until the connecting strip breaks away from the mounted parts.

The present invention relates to strips of metal parts of the kind having a break-away connecting strip, intended for gang assembly. Typically such strips have projecting parts that should be aligned for insertion into a row of holes. The strip may be somewhat curved, either due to the way it was produced or due to the use of very thin metal. That curvature distorts the distribution pattern of the parts in relation to the receptor holes. An object of the present invention resides in a novel form of such strip of parts that assures maintaining the parts in their intended pattern for gang assembly or insertion.

Forming the weakening incisions in such strips may be a critical matter, especially where any one length of parts is to carry a relatively large number of parts. Incisions that are too deep may lead to one or more parts breaking away prematurely. Shallow incisions increase the force required to rock the break-away strip, making it hard to remove the strip and exposing the receptor of the parts to possibly damaging stresses as the break-away strip is rocked. Accordingly, a further object of the invention resides in providing a novel strip of parts having a break-away connecting strip, wherein the weakening incisions can be made relatively deep and relatively non-critical, without corresponding risk of premature break-away of one or more of its parts.

A further object of the invention resides in providing novel strips of parts that are well suited to resist the forces that are applied to them after they have been assembled to a printed circuit board or the like, notably the force imposed on each part when the break-away strip is being removed. Such a part may also be subject to more-or-less severe stresses in use, for example where each part is a plug-in terminal that is forcibly driven into or pulled away from a pair of tight jaws of a companion terminal.

In mounting metal parts on a printed circuit board, a portion of the part formed as a projections or tine may extend through the printed circuit board and be secured in place variously, as by being staked or by being soldered to a metal-foil part laminated to the printed-circuit board, etc. In one aspect of the invention, the anchoring of such part is protected against such stresses by forming each part as a base with two or more spaced-apart projections or tines. The anchoring of each such part is rendered largely immune to tilting stresses imposed on the part by virtue of a base or bridge having spaced-apart tines that penetrate the printed circuit board and are fixed in place as by soldering. Each tine tends to shield the other from tilting leverage.

In a further aspect of the invention, the depth of the incisions (which is prone to variation in the course of production) is rendered less critical than heretofore. In the common form of break-away strips, the incisions across connecting necks extend along the hinge line about which the break-away strip is forcibly tilted for removal. Where the incisions are shallow, it may be difficult to tiltthe break-away strip, and repeated back-and-forth motions may prove necessary. Pursuant to one aspect of the invention, the incisions extend across (rather than along) the hinge line, so that tilting of the break-away strip causes tearing of the incised connections. In production, it is easy to maintain a uniform width of the connecting neck and a correspondingly uniform length of the incisions. Given a neck that is short in relation to the lever-length of the hinging break-away strip, the connection tears along the incision dependably during the first tilt operation of the break-away strip. Complete removal ensues readily. The depth of the incisions is relatively non-critical.

In another aspect of the invention, a greater degree of weakening produced by the aforementioned incisions is rendered practical and relatively non-critical by providing the series of parts with two break-away connecting strips that have spaced-apart incised connections to each part. In this way, each of the two break-away strips can be made easier to remove than would be feasible where only one break-away strip is used. In the case of each part of a series being secured to two break-away strips at spaced-apart weakened connections, the connections can be made quite weak without risking premature break-away of one or more of the parts. Each break-away strip can then be relatively easy to remove even where each break-away strip has incised connections to a relatively large number of parts. Stronger connections would be needed were each part supported in cantilever fashion by but one break-away strip, and that strip would therefore be relatively difficult to remove, especially where many such parts are to be parted from the break-away strip concurrently. Where only one break-away strip is used, each part could be prone to unintended break-away as the result of its being flexed about a weakened connection at one end and left unsupported at its opposite end.

In a further aspect of the invention related to the foregoing, protection is provided against deformation of the intended pattern of parts which are to be gang-assembled to a companion pattern of the receptor. The parts have projections providing free ends that are to meet corresponding elements of the receptor. A pattern of projection ends would be distorted due to warping of a strip of parts bearing the projections or due to flexing of the strip of parts. In this aspect of the invention, corresponding portions of the strip of parts are fixed in different planes. Usually but not necessarily, those planes intersect each other. For example, a series of parts can have portions that are interconnected and disposed in one plane while a break-away strip in an intersecting plane is also connected to those parts and may even provide the interconnection—or the only interconnection—between the parts. The strip of parts is transformed by its stiffness into a stick of parts. The pattern of the ends of projections extending from the parts is stabilized in readiness for the intended gang-assembly operation to a corresponding pattern of elements such as holes in a printed circuit board.

In the preferred embodiment of the invention that is described in detail below, the foregoing novel aspects of the invention are used together, and some of those novel aspects complement one another in attaining certain advantages. Each described strip of parts shown in the accompanying drawings has a series of parts each of which has two spaced-apart tines. The projections or tines of all the parts collectively extend to free ends forming a pattern corresponding to a pattern of holes in a printed circuit board. Each part also has another element that projects and forms a plug-in contact to mate with a companion contact, which may have gripping jaws, for example.

The illustrative sticks of parts involve a few very different portions that "project" which are identified in the exposition below by the following terms of reference. The portions of the metal parts that are shaped as plug-in contacts are also referred to as "projecting elements" or "elements that project". The "fingers" that extend from the break-away strips into spaces between the parts of a row are also called "projecting portions." The parts having projecting "tines", also called "projections", provide "free ends" that are distributed in a pattern matching a like pattern of receptor elements, being holes in a printed circuit board in the illustrative embodiment of the invention.

In the preferred embodiment, two break-away strips unify the series of parts at four spaced-apart necks that are weakened by incisions, two such necks for each of the break-away strips.

In the preferred embodiment, four incised necks are all connected to the base portion of each part, all the base portions being disposed in a common plane. Each of the break-away strips comprises a connecting band and projecting portions are fingers extending from the connecting band to free ends. The free end of each finger is interposed between the base portions of two successive parts ("a pair of successive parts") of the series of parts. Each end of a finger has two incised necks extending from the two parts of the series between which that finger extends. The necks of each set of finger ends are in a row parallel to the connecting band from which the fingers extend, so that the two break-away strips have two rows of necks connecting the ends of the fingers to the series of parts.

There is an incision across each of the necks. The necks at the finger ends of each break-away strip are distributed in a row, and the incisions across those necks are disposed across a line traversing those necks. When all the tines are secured in the printed circuit board and when that break-away strip is tilted about its row of connecting necks, the necks tear along the incisions. Tearing is incomplete, but the remainders of the connections are very weak so that the break-away strip is easily removed by additional hinging movement(s).

The finger ends which extended between successive pairs of parts are part of the removed break-away strip, so that each of the series of parts becomes separated electrically from and spaced physically from the adjacent parts of the series.

The pair of spaced-apart projections or tines of each base imparts mechanical stability that readily resists the stresses developed on each base when first one and then the other of the break-away strips is forcibly tilted and removed. The same tines assure firm retention of each base that supports a respective projecting plug-in contact.

The bases and connecting necks of all the parts are in a first plane, and the break-away strips are out of that plane—actually perpendicular to that plane—so that the strip is stiff and becomes a stick. The parts and their tines become securely oriented, so that the pattern assumed by the free ends of the projections or tines is firmly stabilized, and therefore it dependably corresponds to the pattern of the tine-receiving holes in the printed circuit board to which the parts are gang-assembled. The same characteristic applies equally where the projections of the parts (the tines in this example) are to be gang-assembled and secured to a like pattern of receiving elements other than holes.

The nature of the invention together with the foregoing and other objects, novel aspects and advantages will be more fully appreciated from the following detailed description of the presently preferred embodiment of the invention and certain modifications which are shown in the accompanying drawings.

In the drawings:

FIG. 1 is a side view of part of the length of a stick of parts, being an illustrative embodiment of the invention in its various aspects;

FIG. 2 is a left-hand end view of the embodiment in FIG. 1;

FIG. 3 is a view of part of a flat stamping of metal as it is formed initially, in producing the stick of parts of FIGS. 1 and 2, FIG. 3 being enlarged;

FIGS. 4 and 5 are greatly enlarged fragmentary views of the embodiment of FIGS. 1 and 2, FIG. 4 being a top plan view thereof and FIG. 5 being a side view corresponding to FIG. 1;

FIG. 6 is a greatly enlarged cross-section of the embodiment of FIGS. 1 and 2 as viewed at the plane 6—6 in FIG. 5;

FIG. 7 is a greatly enlarged fragmentary isometric view of the embodiment of FIGS. 1 and 2 as seen looking toward the right in FIG. 6;

FIG. 8 is a greatly enlarged cross-section of the embodiment in FIGS. 1 and 2 at the plane 8—8 in FIG. 5. FIG. 8 showing the stick of parts as manufactured and then mounted on a printed circuit board;

FIG. 9 is a view corresponding to FIG. 8, wherein break-away strips are bent outward, in the process of being removed;

FIG. 10 is an enlarged fragmentary isometric view of the assembled parts of FIG. 9 after removal of the break-away strips, being the final state in the use of the stick of parts in FIGS. 1 and 2;

FIG. 11 is an enlarged cross-section of the parts in FIG. 10 at the plane 11—11 in FIG. 10; P FIG. 12 is a modification of the embodiment of FIGS. 1–11, corresponding to FIG. 8; and FIGS. 13 and 14 are enlarged fragmentary isometric views of two other modifications.

Referring now to FIGS. 1–11, FIG. 3 represents a stamping of sheet-metal, e.g. three-quarters-hard brass 0.31 inch thick by 1.15 (approx.) wide. In FIG. 3, the same reference numbers are used as those which identify the corresponding portions of the finished product. The series of parts 14 are unified by first and second break-away connection strips 10 and 12. In an example, a stick of parts, each having a projecting element or stab and its mounting structure, has twenty-two such parts 14 interconnected by strips 10 and 12. Each part 14 includes a base or bridge 16 bearing projections or tines 18 and 20 and a "stab" 22, being a plug-in contact that is to mate with a companion contact (not shown). Typically, that companion contact has a pair of jaws that grip the stab or stab contact firmly yet resiliently.

Each strip 10 and 12 has a series of projecting portions or fingers 10a, 12a extending from its interconnecting band 10b, 12b. Fingers 10a and 12a extend into spaces between successive bases 16. Any one base has connections 24 to two fingers 10a and connections 26 to two fingers 12a. Regarded from a somewhat different point of view, these same connections (and the ends of fingers 10a and 12a) extend between and provide four connections between each base 16 and its neighboring bases. The stamping of FIG. 3 also includes fingers 28 of fingers 10a and 12a.

The stamping of FIG. 3 is subjected to a number of additional operations, to attain the form shown in FIGS. 4–7. Tines or projections 18 are bent down at right angles to base 16 as the tines are lanced. Tines or projections 20 are bent down from base 16 so that tines 18 and 20 are parallel to each other. The free ends of the tines form a pattern corresponding to holes in a printed circuit board to which the stab terminals are to be mounted. Bases 16 are clamped firmly during the various bending operations that are performed. At the same time, the two rows of connections 24 and 26 and finger extensions 28 are also gripped. Break-away connection strips 10 and 12 are bent at right angles to the common plane of bases 16 and of connections 24 and 26 and of extensions 28 so as to resemble a channel with depending tines as viewed in FIGS. 2 and 6. Fingers 10a and 12a are bent close to their "free" ends (remote from interconnecting bands 10b and 12b). As a result, the bending stresses are concentrated close to connections 24 and 26 in the example of FIGS. 1–7. Finger extensions 28, being clamped, serve to prevent connections 24 and 26 from becoming distorted as the fingers are being bent. Stabs 22 are bent upright, together with the bending of break-away strip 10.

Dimples are struck into the upper surface of bases 16, creating opposite bumps 30 (FIGS. 6 and 8). As will be seen, these bumps 30 provide an assured uniform spacing between bases 16 and the printed circuit board to which parts 14 are mounted.

Incisions 32 are formed all across connections 24 and 26. Connections 24 are aligned so as to form a row, and their incisions also extend across the row of connections 24. Connections 26 form another row, and each incision 32 in connections 26 extends across its row of connections. As is explained below, this configuration facilitates parting of the break-away strips 10 and 12 from bases 16. Removal of the break-away strips leaves each part 14 spaced substantially from the neighboring part(s) 14.

The bends, and the dimples/bumps 30 and the incisions 32 can be formed on (in) the stamping of FIG. 3 in any desired sequence and, indeed, some of these operations may be performed incidental to the stamping operation.

The base 16 of each part 14 is joined at its opposite ends to two break-away strips 10 and 12, respectively. That configuration provides great stability for enabling each part to resist random impacts that might develop in the course of handling the finished strip of parts. This stability is imparted by spaced-apart connections to the two break-away strips even where relatively deep incisions 32 are formed. These parts are not supported as cantilevers, where a joint at its supported end is subjected to a force applied to its opposite end, multiplied by the lever length. Instead, each row of connections acts directly in resisting force applied at its end of base 16. Thus a random force acting at one end of a base does not develop rupture-inducing leverage about the other row of connections. More explicitly, the row of connections 24—even though that row is weakened by incisions 32—resists tilting of that part about the other row of incised connections 26, and conversely, the row of connections 26 provides resistance against part 14 being tilted about and ruptured at the row of incised connections 24. Accordingly, the two break-away strips complement each other in a way that is not merely additive in enabling the connected parts to remain secured in place despite random blows that may develop in handling the strips of parts.

Each base 16 is connected to each of its neighboring bases 16 in the series. If any one base had only one breakable connection or only a pair of breakable connections in line (in the manner of a hinge) then a random, accidental blow might break a part 14 free. However, because the connections 24 to each base 16 are at its opposite sides and connections 26 are also at opposite sides of base 16, each connection provides protection against hinging of the part (and breaking) about the other connection.

In the described construction, each base 16 becomes separated physically and electrically from the neighboring bases in the series when the break-away strips are removed. For this reason, the connection from each base 16 to the next includes two incisions, and the "free" end of a finger on a break-away strip is a removable part of the connection. Incisions 32 are formed at both sides of each finger end. When the finger end is broken away, a gap is left between the previously interconnected bases 16, thereby developing prominent spacing that may be required.

It is of particular importance to provide assurance that all of the parts 14 are intact as part of the strip of parts. If but a single part 14 were knocked away before the strip is to be applied to a printed circuit board, the entire strip of parts would usually have to be rejected. And if a strip of parts 14 lacking one or more of those parts were assembled to a printed circuit board inadvertently, the entire printed circuit board would be rejected. Secure retention of each part 14 is thus very important. However it is also important for each connection 24, 26 to be easily breakable so that the break-away strip can be broken free without undue stress. This is especially true where the strip has many parts 14. This requirement is met by making incisions 32 appropriately short and deep. An noted above, each incision extends all across its respective connection and, in an example, the width of each connection equals the sheet-metal thickness. Due to various factors, the weakening of the connections is not critical, and parts 14 are not knocked free accidentally because the incised connection to each part are distributed so as to prevent tilting of the parts about aligned incisions.

The strip of parts 14 is assembled as a unit to a printed circuit board, in a gang-assembly operation. It has been said above that the free ends of projections or tines 18 and 20 form a pattern like a pattern of holes that the tines can enter in a printed circuit board. Bases 16 and their connections 24 and 26 are disposed in a first plane. Break-away strip 10 is displaced out of that plane, actually being disposed at right angles to the plane of bases 16. The same is true of break-away strip 12 and the plane of bases 16. Each break-away strip and the bases 16 joined by connections 24 and 26 form an angled structure that is stiff. A stick of parts 14 results. The stiffness of the stick guards against the series of parts becoming warped and against the series of bases 16 becoming bowed out of a plane. Such distortions would disturb the pattern formed by the free ends of the tines and would complicate their insertion concurrently into the pattern of holes in a printed-circuit board.

In the intended use, tines 18 and 20 are inserted into holes through the printed-circuit board 34 that bears a separate patch of copper foil 36 for each part 14, correspondingly providing a circuit connection to each stab 22. The ends of the tines may then be deformed for mechanically holding the parts 14 fully mounted and with their bumps 30 against board 34. Next, the printed-circuit board is exposed to flowed soldering flux and finally to flowed solder. Solder 35 unites each part 14 at each of its tines to the printed circuit board (FIG. 8).

Each break-away strip is then forced outward (FIG. 9) in an operation that causes the connections 24 and 26 to shear at their incisions 32. During the tilting motion, the shearing develops progressively along each of the incisions. Each row of connections twists about an axis along the row. Theoretically, the axis is midway between the ends of its incisions. The initial tilting may cause completed fractures if the metal is relatively hard. Otherwise, since most of the metal at each incision has been torn by the time the related finger has been tilted outward, the residual connecting metal can be parted readily by slight rocking of the fingers 10a, 12a.

The entire operation of breaking away each of the connecting strips 10 and 12 is made relatively easy, after bases 16 have been securely anchored to the printed circuit board. Parting is promoted by several factors separately and in concert. Easy parting is promoted by the progressive shearing that takes place at each incision, and by the relatively deep incisions that can be made without serious risk of a part being knocked free in handling. The distribution of the weakened connections renders them effective to resist random impacts, as explained above.

The stabs or contacts 22 are isolated from the incision-weakened connections. No incision 32 occurs along a margin of stabs 22. Moreover, because base 16 of each part 14 is securely anchored by tines 18 and 20, stabs 22 are isolated from the stresses imposed on parts 14 as each of the break-away strips is being removed. In practice, many stabs (twenty-two stabs in an example) can be securely mounted concurrently and they become electrically disconnected and physically spaced apart. The spacing can be dimensioned to impart any required insulation creep distance across the surface of the printed circuit board. The spaced-apart tines and the base of each part 14 provide secure and stable support for each stab 22, against stresses imposed on it during plugging-in and disconnection from companion gripping contacts (not shown).

Bumps 30 are an expedient for avoiding capillary travel of soldering flux between base 16 and board 34. If base 16 were arranged directly against board 34, not only would soldering flux tend to be drawn into the interface but the flux would resist subsequent cleaning efforts so that corrosion could develop. Bumps 30 of bases 16 bear solidly against the printed circuit board and provide firm support for each part 14 with clearance space for cleaning away the solder flux.

FIGS. 12-14 illustrate modifications that attain certain of the advantages of the embodiment in FIGS. 1-11. Because the embodiment of FIG. 12 is identical to that in FIGS. 1-11 but for the omission of bumps 30 from FIG. 12, corresponding numerals in FIG. 12 bear an asterisk. Primed numerals are used in FIG. 13 and double-primed numerals are used in FIG. 14, for parts corresponding to those of FIGS. 1-11. Their description is not repeated in the interest of conciseness.

Referring to FIG. 12, base 16 bears against panel 34. Therefore when either break-away strip is forced outward, it pivots on its bends as they bear against panel 34*. Whether such bearing were to commence immediately or after a limited amount of tilt of strip 12* (or strip 10*) the weakened connections 26* (as well as connections 24*) tear progressively, most rapidly in proportion to the distance of each point along the incisions from the pivotal axis. This axis, momentarily, may be the same as in FIGS. 1-11. The pivotal axis of the break-away strip then shifts progressively as the bent corner of each finger 12a bears against the hard printed-circuit board. Simple outward tilt of strip 12* may suffice for parting that strip from the parts 14* that are anchored to the printed circuit board. A sharp bend close to each incision promotes easy rupture of the incised connections.

In FIG. 13, connections 24' are provided between each finger end and the bases 16' of the parts 14' that flank the finger. Unlike FIGS. 1-11, only one break-away strip 10' is provided, and there is only one row of incised connections 24' between the series of parts 14'. Connections 24' are half-way between tines 18' and 20', so there is no need for extension 28 in FIGS. 1-7.

Particularly because of the protection afforded by break-away strip 10' for stabs 22', the probability of a random blow against one of the parts 14' may not be a significant danger. Bases 16' are all coplanar and their plane is at right angles to the plane of connecting band 10b'. Consequently, the series of interconnected parts 14' is a stiff series, a stick of parts. The projecting pairs of tines 18', 20' are parallel and they tend to be held stably in their initial pattern, in condition to enter a like pattern of holes in a printed-circuit board.

The stick of parts in FIG. 13 has a few disadvantages as compared to that in FIGS. 1-11. Since each base 16' has only two connections holding it in its plane, and since base 16 could be tilted about an axis along the row of connections 24', it may be wise to strengthen connections 24' by making incisions 32' shallower than incisions 32 in FIGS. 1–11. If incisions 32' are made shallower, then it follows that more force would be needed for tilting break-away strip 10' to break connections 24' after parts 14' are secured to a printed circuit board. To the extent that connections 24' are weakened for facilitating removal of the break-away strip, parts 14' become vulnerable to being tilted so that its tines would be shifted out of their prescribed pattern, and parts 14 could even be knocked free by an accidental blow. With careful handling, the stick of parts 14' may prove satisfactory.

The embodiment of FIG. 14 illustrates bases 16" parts of the row of parts separated from each other by gaps G, and a row of connections 26". Incisions 32" that cross connections 24" are formed in line with each other. Such aligned incisions do not tear when break-away strip 12" is rocked in removing it. Parting of the break-away strip depends on fracturing the metal, quickly where the sheet-metal is brittle or as the result of back-and-forth rocking for work-hardening the metal until it fractures where the sheet-metal is ductile. Of greater concern is the problem of using such aligned incisions at the opposite end of the part where the stabs (cf. stabs 22) are to be formed. That design problem leads to fewer stabs per inch where the same spacing as in FIG. 10 is required from each stab to the next. The design problem may be no concern where other metal parts are to be formed in a stick of parts, for other purposes, in place of the stabs 22 with their bases 16 and their tines 18 and 20.

The foregoing sticks of parts are illustrative of other analogous parts that may be produced embodying the novel features described above. Moreover, the illustrative sticks of stabs may be modified by those skilled in the art, omitting one or more of the novel features. Consequently, the invention should be construed broadly in accordance with its true spirit and scope.

What is claimed is:

1. A strip of parts for gang-assembly to companion portions of a receptor, said strip of parts being a sheet-metal stamping including a row of mutually spaced-apart parts and a break-away strip extending alongside the row of parts and having projecting portions disposed in the spaces between said parts and joined to those parts by a row of connections that extends along the row of parts, said connections being weakened by incisions transverse to the row of connections, to the break-away strip and to the row of parts, so that rocking of the break-away strip relative to the row of parts about an axis along the row of connections tends to tear the connections.

2. A strip of parts as in claim 1, wherein a portion of each part and of said projecting portions connected thereto are in a first plane and said break-away strip is disposed largely out of said first plane, thereby stiffening the strip of parts to constitute a stick of parts.

3. A strip of parts as in claim 1 wherein a respective projecting portion of said break-away strip is disposed between each part in the row of parts and the next, each of said projecting portions being joined by a said connection to at least one of said parts.

4. A strip of parts as in claim 1 wherein a respective projecting portion of said break-away strip is disposed between each part in the row of parts and the next, each of said projecting portions being joined by a said connection to each of the parts between which such projecting portion is disposed.

5. A strip of parts as in claim 4 wherein said row of parts and said row of connections define a continuous metal strip and wherein said break-away strip and said continuous metal strip are largely disposed out of a common plane for stiffening the strip of parts.

6. A strip of parts as in claim 4 wherein said parts and said break-away strip are largely in planes at right angles to each other.

7. A strip of parts for gang assembly to companion portions of a receptor, said strip of parts being a sheet-metal stamping including a row of mutually spaced-apart parts and two break-away strips extending alongside said row of parts, each break-away strip having projecting portions disposed in the spaces between said spaced-apart parts and joined to said parts by a corresponding row of connections, the connections of each row being weakened by incisions transverse to the respective row of connections, to said row of parts and to said break-away strips, so that rocking of each break-away strip relative to the row of parts tends to tear the connections to said parts.

8. A strip of parts as in claim 7 wherein the rows of connections of the two break-away strips to said parts are mutually spaced apart.

9. A strip of parts as in claim 8 wherein each of said projecting portions is joined to each of the parts between which it is disposed.

10. A strip of parts as in claim 9 wherein said row of parts and said connections define a continuous metal strip and wherein at least one of said break-away strips and said continuous metal strip are disposed largely out of a common plane for stiffening the strip of parts.

11. A stick of parts as in claim 9 wherein each of said parts has a spaced-apart pair of said incision-weakened connections to each of said two break-away strips.

12. A stick of parts as in claim 11 wherein said break-away strips are largely in spaced-apart parallel planes at right angles to a plane containing the portions of said parts having said connections to said break-away strips.

13. A stick of parts for gang assembly to a pattern of receptor elements, said stick of parts being a sheet-metal stamping comprising a series of mutually spaced-apart parts distributed in a row along the stick, and first and second break-away strips along said stick of parts having, respectively, first and second rows of incision-weakened break-away connections to said parts, said connections including a break-away connection between each of said break-away strips and each of said parts for unifying said parts and said break-away strips, said parts having portions lying in a first plane and having projections that provide free ends disposed in a pattern corresponding to the pattern of receptor elements, at least one of said break-away strips being largely displaced from said first plane for rendering said stick of parts stiff and thereby stabilizing the pattern assumed by the free ends of said projections.

14. A stick of parts as in claim 13 wherein both of said break-away strips are in planes parallel to each other and perpendicular to said first plane.

15. A stick of parts as in claim 13 wherein at least one of said break-away strips has a connection band along the stick and a series of fingers extending transversely from said one connection band to finger ends remote from the connection band, said finger ends being interposed between respective pairs of parts of the series and each of said finger ends being connected by respective ones of said break-away connections to both of the parts between which each such finger end is interposed, each said connection being weakened by an incision transverse to the stick of parts.

16. A stick of parts as in claim 13 for use with a printed circuit board having a pattern of holes constituting said receptor elements, wherein said projections are formed as tines to enter said holes, and wherein said parts have second tines, respectively, spaced from the first-mentioned tines, the portion of each part between the tines thereof constituting a base, said break-away strips maintaining the free ends of the tines in a stable pattern for entering the pattern of holes in the printed circuit board, each said part having a third projection formed as a plug-in contact, whereby when said parts have been mounted on a printed circuit board with the tines secured thereto, the tines and base of each part provide secure orientation of the plug-in contact of each said part despite stresses that develop when the break-away strips are being rocked for removal and when the plug-in contacts are being forcibly engaged with and disengaged from companion contacts.

17. A stick of parts as in any of claims 13, 14 or 16 wherein at least one of said break-away strips has a continuous band along the stick and a series of fingers extending transversely from said continuous band to ends remote from said band, said finger ends extending between each successive pair of parts of the series and each finger end being joined to each of a respective pair of said parts by a corresponding pair of said break-away connections, and each such connection having an incision transverse to the stick and crossing its related row of connections, so that rocking of said one break-away strip about its row of connections tends to tear such connections along their incisions after said parts have been secured to said receptor elements and so that, when said finger ends are removed from said parts, corresponding spaces are left between the successive pairs of parts of the series.

18. A stick of parts as in any of claims 13, 14 or 16 wherein each of said break-away strips has a continuous band along the stick and a series of fingers extending transversely from the continuous band thereof to ends remote from said band, said finger ends of each of said break-away strips extending between each successive pair of parts of the series and each finger end being joined to each of a respective pair of said parts by a corresponding pair of said break-away connections, and each such connection having an incision transverse to the stick and crossing its related row of connections, so that rocking of each of said break-away strips about their row of connections tends to tear such connections along their incisions after said parts have been secured to said receptor elements and so that, when said finger ends are removed from said parts, corresponding spaces are left between the successive pairs of parts of the series.

* * * * *